United States Patent
Kim et al.

(10) Patent No.: US 10,608,052 B2
(45) Date of Patent: Mar. 31, 2020

(54) DISPLAY SUBSTRATE AND METHOD OF MANUFACTURING THE SAME

(71) Applicant: Samsung Display Co., Ltd., Yongin-Si, Gyeonggi-Do (KR)

(72) Inventors: Hyung-June Kim, Anyang-si (KR); Wan-Soon Im, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/234,645

(22) Filed: Dec. 28, 2018

(65) Prior Publication Data

US 2019/0140028 A1 May 9, 2019

Related U.S. Application Data

(63) Continuation of application No. 15/866,103, filed on Jan. 9, 2018, now Pat. No. 10,211,262, which is a continuation of application No. 14/538,213, filed on Nov. 11, 2014, now Pat. No. 9,881,974.

(30) Foreign Application Priority Data

Jul. 9, 2014 (KR) .................. 10-2014-0086313

(51) Int. Cl.
*H01L 27/32* (2006.01)
*G02F 1/1362* (2006.01)

(52) U.S. Cl.
CPC .... *H01L 27/3213* (2013.01); *G02F 1/136209* (2013.01); *H01L 27/3272* (2013.01); *G02F 2001/136218* (2013.01); *G02F 2001/136222* (2013.01); *H01L 27/322* (2013.01)

(58) Field of Classification Search
CPC .................. H01L 27/322; H01L 27/3213
See application file for complete search history.

(56) References Cited

U.S. PATENT DOCUMENTS

| | | | |
|---|---|---|---|
| 5,994,721 A | 11/1999 | Zhong et al. | |
| 7,638,800 B2 | 12/2009 | Yu et al. | |
| 8,390,753 B2 | 3/2013 | Choi | |
| 9,007,289 B2 * | 4/2015 | Lee | G02F 1/13624 345/92 |
| 9,128,311 B2 * | 9/2015 | Kitani | G02F 1/13306 |
| 2005/0110930 A1 | 5/2005 | Kim | |
| 2005/0218792 A1 | 10/2005 | Jianpu et al. | |
| 2006/0087598 A1 | 4/2006 | Lee et al. | |

(Continued)

FOREIGN PATENT DOCUMENTS

| | | |
|---|---|---|
| JP | 2005-234524 | 9/2005 |
| KR | 10-2013-0001628 | 1/2013 |

(Continued)

*Primary Examiner* — Caridad Everhart
*Assistant Examiner* — Ankush K Singal
(74) *Attorney, Agent, or Firm* — Innovation Counsel LLP

(57) ABSTRACT

A display substrate includes a first switching element electrically connected to a gate line extending in a first direction and a data line extending in a second direction crossing the first direction, an organic layer disposed on the first switching element, a shielding electrode disposed on the organic layer and overlapping the data line, a pixel electrode disposed on the same layer as the shielding electrode and a light-blocking pattern disposed on the shielding electrode and adjacent to a corner of the pixel electrode

8 Claims, 12 Drawing Sheets

(56) References Cited

U.S. PATENT DOCUMENTS

| | | |
|---|---|---|
| 2006/0125989 A1 | 6/2006 | Park et al. |
| 2006/0231838 A1* | 10/2006 | Kim ................ G02F 1/136213 |
| | | 257/59 |
| 2008/0018836 A1 | 1/2008 | Huh et al. |
| 2008/0068550 A1 | 3/2008 | Chang et al. |
| 2009/0122247 A1 | 5/2009 | Chang |
| 2009/0290114 A1 | 11/2009 | Na et al. |
| 2009/0310075 A1 | 12/2009 | Kim |
| 2010/0007811 A1 | 1/2010 | Choi |
| 2010/0020257 A1 | 1/2010 | Jun et al. |
| 2010/0165223 A1 | 7/2010 | Cho et al. |
| 2010/0270553 A1 | 10/2010 | Choi et al. |
| 2011/0051057 A1 | 3/2011 | Song et al. |
| 2011/0051059 A1 | 3/2011 | Kang et al. |
| 2011/0085103 A1 | 4/2011 | Yang et al. |
| 2011/0169000 A1 | 7/2011 | Bang et al. |
| 2012/0257155 A1* | 10/2012 | Lee ................ G02F 1/134309 |
| | | 349/143 |
| 2012/0299898 A1 | 11/2012 | Yamashita et al. |
| 2013/0057813 A1 | 3/2013 | Jeong et al. |
| 2013/0077031 A1* | 3/2013 | Kim ................ G02F 1/13394 |
| | | 349/106 |
| 2013/0093658 A1 | 4/2013 | Park et al. |
| 2013/0201432 A1 | 8/2013 | Yun et al. |
| 2013/0229449 A1 | 9/2013 | Yun et al. |
| 2014/0043571 A1 | 2/2014 | Chang et al. |
| 2014/0104527 A1 | 4/2014 | Yang et al. |
| 2014/0117385 A1 | 5/2014 | Park et al. |
| 2014/0120795 A1 | 5/2014 | Kim et al. |
| 2014/0211103 A1 | 7/2014 | Baek et al. |
| 2014/0346496 A1 | 11/2014 | Ro et al. |
| 2014/0375534 A1 | 12/2014 | Lee et al. |
| 2015/0092138 A1 | 4/2015 | Kwak et al. |
| 2015/0103296 A1 | 4/2015 | Kwak et al. |
| 2015/0168772 A1* | 6/2015 | Jung ................ G02F 1/13394 |
| | | 349/106 |
| 2015/0168793 A1 | 6/2015 | Oh et al. |
| 2015/0185565 A1 | 7/2015 | Park et al. |
| 2015/0198842 A1 | 7/2015 | Kwak et al. |
| 2015/0198851 A1 | 7/2015 | Park et al. |
| 2015/0228664 A1 | 7/2015 | Lee et al. |
| 2015/0234215 A1 | 7/2015 | Park et al. |
| 2015/0331266 A1* | 11/2015 | Kang ................ G02F 1/13624 |
| | | 257/59 |

FOREIGN PATENT DOCUMENTS

| | | |
|---|---|---|
| KR | 10-2013-0026375 | 3/2013 |
| KR | 10-2013-0030975 | 3/2013 |

* cited by examiner

DISPLAY SUBSTRATE AND METHOD OF MANUFACTURING THE SAME

PRIORITY STATEMENT

This application is a continuation application of U.S. patent application Ser. No. 15/866,103, filed on Jan. 9, 2018, which is a continuation application of U.S. patent application Ser. No. 14/538,213 filed on Nov. 11, 2014 (now U.S. Pat. No. 9,881,974), which claims priority to Korean Patent Application No. 10-2014-0086313, filed on Jul. 9, 2014 in the Korean Intellectual Property Office (KIPO), and all the benefits accruing therefrom under 35 U.S.C. § 119, the contents of the prior applications being herein incorporated by reference.

BACKGROUND

1. Field

The present inventive concept relates to a display substrate and method of manufacturing the display substrate. More particularly, the present inventive concept relates to a display substrate for a liquid crystal display and method of manufacturing the display substrate.

2. Description of the Related Art

A liquid crystal display ("LCD") panel may include an array substrate, an opposing substrate and an LCD layer disposed therebetween. The array substrate may include a plurality of pixel electrodes arranged in a matrix shape. A signal driving part may be configured to apply a desired voltage to the pixel electrodes to drive the LCD panel. A plurality of liquid crystal molecules in the LCD layer may be aligned due to an electric field generated by the voltage.

The LCD panel may include a plurality of color filters. The color filters may be disposed on the array substrate and/or the opposing substrate. In an exemplary embodiment, the color filters may include a red filter (R), a green filter (G) and a blue filter (B). The pixel electrodes may overlap the color filters. The pixel electrodes may be configured to transmit backlight as red light, green light or blue light according to an alignment of the liquid crystal molecules. A pixel area non-overlapping the color filters may transmit the backlight as white light (W).

However, a light-leakage may be occurred at a corner that a red color filter, a green color filter, a blue color filter and a white color filter are adjoining.

SUMMARY

Exemplary embodiments of the present inventive concept provide a display substrate capable of decreasing a light-leakage at a corner of a color filter.

Exemplary embodiments of the present inventive concept further provide method of manufacturing the display substrate.

In an exemplary embodiment of a display substrate according to the present inventive concept, the display substrate includes a first switching element electrically connected to a gate line extending in a first direction and a data line extending in a second direction crossing the first direction, an organic layer disposed on the first switching element, a shielding electrode disposed on the organic layer and overlapping the data line, a pixel electrode disposed on the same layer as the shielding electrode and a light-blocking pattern disposed on the shielding electrode and adjacent to a corner of the pixel electrode.

In an exemplary embodiment, the light-blocking pattern has substantially the same width as the shielding electrode.

In an exemplary embodiment, the light-blocking pattern may have a smaller width than that of the shielding electrode In an exemplary embodiment, the light-blocking pattern may be formed on the shielding electrode in which four pixel electrodes adjoin.

In an exemplary embodiment, the four pixel electrodes may be a red pixel electrode, a green pixel electrode, a blue pixel electrode and a white pixel electrode.

In an exemplary embodiment, the light-blocking pattern may include an opaque metal In an exemplary embodiment, the pixel electrode may include a high-pixel electrode and a low-pixel electrode spaced apart from the high-pixel electrode.

In an exemplary embodiment, the first switching element may be electrically connected to the high-pixel electrode.

In an exemplary embodiment, the display substrate may further include a first storage line disposed on the same layer as the gate line and extending in the first direction and a second storage line disposed on the same layer as the data line and extending in the second direction.

In an exemplary embodiment, the display substrate may further include a second switching element electrically connected to the gate line, the data line and the low-pixel electrode and a third switching element electrically connected to the gate line and the second switching element.

In an exemplary embodiment, the organic layer may be a color filter layer having a red color, a green color, a blue color or a white color.

In an exemplary embodiment of a display substrate according to the present inventive concept, the display substrate includes a first switching element electrically connected to a gate line extending in a first direction and a data line extending in a second direction crossing the first direction, an organic layer disposed on the first switching element, a light-blocking pattern partially overlapping the organic layer and extending in the second direction to overlap the data line, and a pixel electrode. The light-blocking pattern includes a first portion formed as a first width and a second portion formed as a second width wider than the first width. The second portion may be formed adjacent to a corner of the pixel electrode. The second portion may be formed on the data line in which four pixel electrodes adjoin. The first width may be wider than a width of the data line. The four pixel electrodes may be a red pixel electrode, a green pixel electrode, a blue pixel electrode and a white pixel electrode.

In an exemplary embodiment, the pixel electrode may include a high-pixel electrode and a low-pixel electrode spaced apart from the high-pixel electrode.

In an exemplary embodiment, the first switching element may be electrically connected to the high-pixel electrode.

In an exemplary embodiment, the display substrate may further include

In an exemplary embodiment of a method of manufacturing a display substrate according to the present inventive concept, the method includes a second switching element electrically connected to the gate line, the data line and the low-pixel electrode and a third switching element electrically connected to the gate line and the second switching element.

In an exemplary embodiment, the organic layer may be a color filter layer having a red color, a green color, a blue color or a white color.

In an exemplary embodiment of a method of manufacturing a display substrate according to the present inventive concept, the method includes forming a first switching element electrically connected to a gate line extending in a first direction and a data line extending in a second direction crossing the first direction on a base substrate, forming an organic layer on the first switching element, forming a transparent electrode layer on the organic layer, forming a light-blocking metal layer on the transparent electrode layer, patterning the light-blocking metal layer to form a light-blocking pattern and patterning the transparent electrode layer to form a shielding electrode and a pixel electrode. The light blocking layer may be disposed on the data line adjacent to a corner of the pixel electrode. The light-blocking pattern may be disposed on the data line in which adjacent four pixels adjoin. The four pixel electrodes may be a red pixel electrode, a green pixel electrode, a blue pixel electrode and a white pixel electrode. The forming the transparent electrode layer may include forming a pixel electrode and a shielding electrode, the shielding electrode being disposed on the organic layer and overlapping the data line.

In an exemplary embodiment, the organic layer may be a color filter layer having a red color, a green color, a blue color or a white color.

In an exemplary embodiment, the light-blocking pattern may be disposed adjacent to a corner of the pixel electrode.

In an exemplary embodiment, the pixel electrode may include a high-pixel electrode and a low-pixel electrode spaced apart from the high-pixel electrode.

In an exemplary embodiment of a method of manufacturing a display substrate according to the present inventive concept, the method includes forming a first switching element electrically connected to a gate line extending in a first direction and a data line extending in a second direction crossing the first direction on a base substrate, forming an organic layer on the first switching element, forming a transparent electrode layer on the organic layer, patterning the transparent electrode layer to form a pixel electrode and forming a light-blocking pattern partially overlapping the organic layer and extending in the second direction to be overlapped with the data line on the base substrate on which the pixel electrode is formed. The light-blocking pattern includes a first portion formed as a first width and a second portion formed as a second width wider than the first width. The second portion may be formed adjacent to a corner of the pixel electrode. The second portion may be formed on the data line in which four pixel electrodes adjoin. The four pixel electrodes may be a red pixel electrode, a green pixel electrode, a blue pixel electrode and a white pixel electrode.

In an exemplary embodiment, the organic layer may be a color filter layer having a red color, a green color, a blue color or a white color.

In an exemplary embodiment, the pixel electrode may include a high-pixel electrode and a low-pixel electrode spaced apart from the high-pixel electrode.

According to the present inventive concept as explained above, a light-blocking pattern is disposed on the shielding electrode. The light-blocking pattern includes an opaque metal. The light-blocking pattern is disposed on an area in which four pixel electrodes adjoin, so that the light-blocking pattern may decrease a light-leakage occurred between four pixel electrodes.

In addition, a light-blocking pattern includes a second portion having a wider width in a structure in which a shielding electrode is not formed. The second portion is disposed on an area in which four pixel electrodes adjoin, so that the light-blocking pattern may decrease a light-leakage occurred between four pixel electrodes.

BRIEF DESCRIPTION OF THE DRAWINGS

The above and other features and advantages of the present inventive concept will become more apparent by describing in detailed exemplary embodiments thereof with reference to the accompanying drawings, in which.

DETAILED DESCRIPTION OF THE INVENTIVE CONCEPT

Hereinafter, the present inventive concept will be explained in detail with reference to the accompanying drawings.

Figure 1:
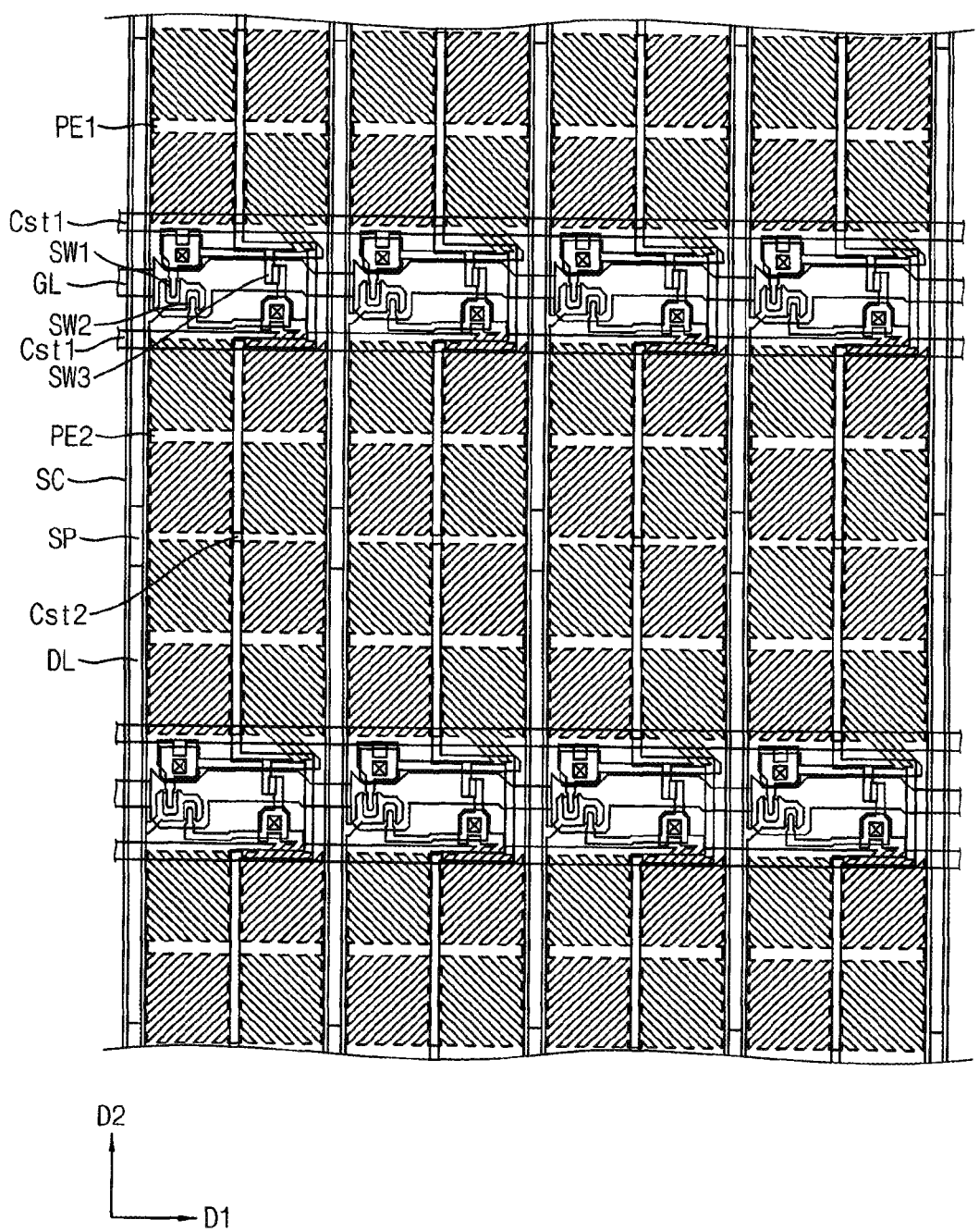
FIG. 1 is a plan view illustrating a display substrate according to an exemplary embodiment of the inventive concept.
Figure 2:
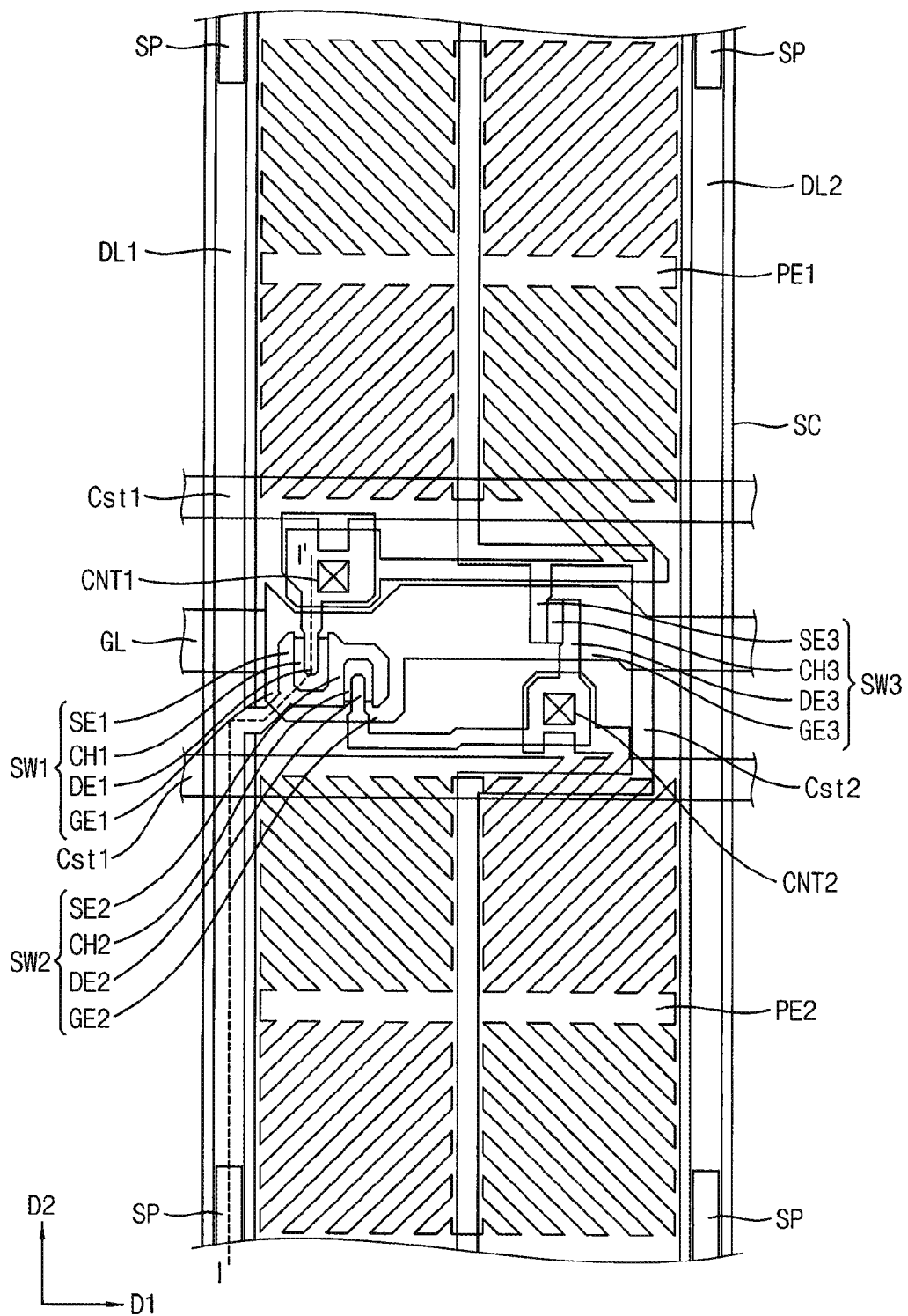
FIG. 2 is a plan view illustrating a unit pixel of the display substrate of FIG. 1.
Figure 3:
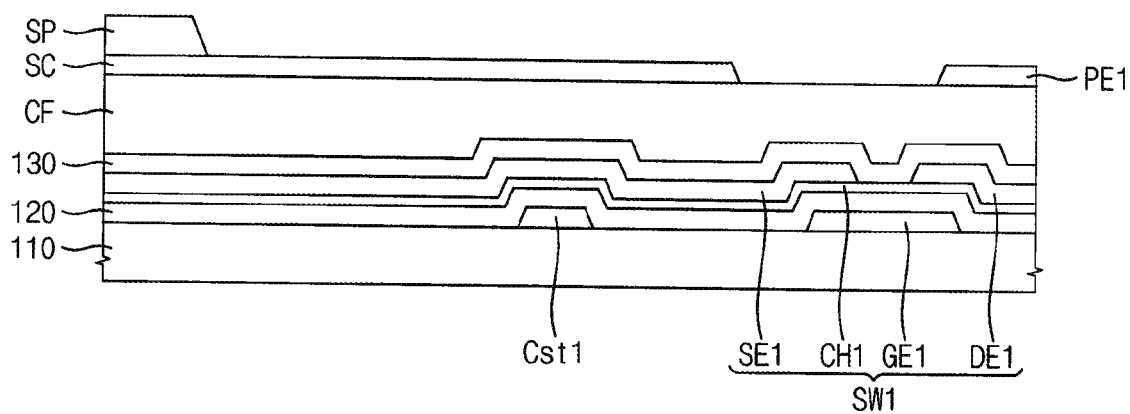
FIG. 3 is a cross-sectional view taken along a line I-I' of FIG. 2.

FIG. 1 is a plan view illustrating a display substrate according to an exemplary embodiment of the inventive concept. FIG. 2 is a plan view illustrating a unit pixel of the display substrate of FIG. 1. FIG. 3 is a cross-sectional view taken along a line I-I' of FIG. 2.

Referring to FIGS. 1 to 3, a display substrate includes a gate line GL, a data line DL, a first storage line Cst1, a second storage line Cst2, a first switching element SW1, a second switching element SW2, a third switching element SW3, a high-pixel electrode PE1 and a low-pixel electrode PE2.

The gate line GL extends in a first direction D1. The gate line GL may have a single layer structure including copper (Cu), silver (Ag), chrome (Cr), molybdenum (Mo), aluminum (Al), titanium (Ti), manganese (Mn) and a mixture thereof. In addition, the gate line GL may have a multi-layer structure having a plurality of layers including materials different from each other. For example, the gate line GL may include a copper layer and a titanium layer disposed on and/or under the copper layer. The gate line GL is electrically connected to a first gate electrode GE1 of the first switching element SW1, a second gate electrode GE2 of the second switching element SW2, and a third gate electrode GE3 of the third switching element SW3. In addition, portions of the gate line GL may form the first gate electrode GE1, the second gate electrode GE2, and the third gate electrode GE3.

The first storage line Cst1 extends in a first direction D1. The first storage line Cst1 overlaps the high-pixel electrode PE1. The first storage line Cst1 is formed of the same layer as the gate line GL. Thus, the first storage line Cst1 may be disposed on the same layer as the gate line GL. The first storage line Cst1 may have a single layer structure including copper (Cu), silver (Ag), chrome (Cr), molybdenum (Mo), aluminum (Al), titanium (Ti), manganese (Mn) and a mixture thereof. In addition, the first storage line Cst1 may have a multi-layer structure having a plurality of layers including materials different from each other. For example, the first storage line Cst1 may include a copper layer and a titanium layer disposed on and/or under the copper layer.

A first insulation layer 120 is formed on the gate line GL and the first storage line Cst1. The first insulation layer 120 may include an inorganic material such as silicon oxide (SiOx) and/or silicon nitride (SiNx). For example, the first insulation layer 120 includes silicon oxide (SiOx), and may have a thickness of about 500 Å. In addition, the first insulation layer 120 may include a plurality of layers including different materials from each other.

The data line DL is formed on first insulation layer 120. The data line DL extends in a second direction D2 crossing the first direction D1. The data line DL crosses the gate line GL with an intervening the first insulation layer 120. The data line DL may have a single layer structure including copper (Cu), silver (Ag), chrome (Cr), molybdenum (Mo), aluminum (Al), titanium (Ti), manganese (Mn) and a mixture thereof. In addition, the data line DL may have a multi-layer structure having a plurality of layers including materials different from each other. For example, the data line DL may include a copper layer and a titanium layer disposed on and/or under the copper layer. The data line DL may be electrically connected to a first source electrode SE1 of the first switching element SW1, and a second source electrode SE2 of the second switching element SW2.

The second storage line Cst2 is formed from the same layer as the data line DL. Thus, the second storage line Cst2 may be disposed on the same layer as the data line DL. The second storage line Cst2 may have a single layer structure including copper (Cu), silver (Ag), chrome (Cr), molybdenum (Mo), aluminum (Al), titanium (Ti), manganese (Mn) and a mixture thereof. In addition, the second storage line Cst2 may have a multi-layer structure having a plurality of layers including materials different from each other. For example, the second storage line Cst2 may include a copper layer and a titanium layer disposed on and/or under the copper layer. The second storage line Cst2 may be electrically connected to a third source electrode SE3 of the third switching element SW3.

A second insulation layer 130 is formed on the data line DL and the second storage line Cst2. The second insulation layer 130 may include an inorganic material such as silicon oxide (SiOx) and/or silicon nitride (SiNx). For example, the second insulation layer 130 includes silicon oxide (SiOx), and may have a thickness of about 500 Å. In addition, the second insulation layer 130 may include a plurality of layers including different materials from each other.

An organic layer CF is disposed on the second insulation layer 130. The organic layer CF planarizes an upper surface of the substrate so that problems due to the step such as disconnection of a signal line may be prevented. The organic layer CF may be an insulation layer including an organic material. For example, the organic layer CF may a color filter layer.

When the organic layer CF is a color filter layer, the color filter layer may be a color filter layer having a red color, a green color, a blue color or a white color. In addition, the color filter layer having a red color, the color filter layer having a green color, the color filter layer having a blue color and the color filter layer having a white color may be formed sequentially on a red pixel, a green pixel, a blue pixel and a white pixel, respectively.

A shielding electrode SC is disposed on the organic layer CF. The shielding electrode SC may include a transparent conductive material, such as indium tin oxide (ITO) and indium zinc oxide (IZO). In addition, the shielding electrode SC may include titanium (Ti) and/or molybdenum titanium (MoTi).

A display panel according to another exemplary embodiment may include a display substrate 100, a facing substrate facing the display substrate 100 and liquid crystal layer interposed between the display substrate 100 and the facing substrate. The facing substrate may include a common electrode. The common electrode is formed on an entire region of the facing substrate and may include a transparent conductive material. In addition, a common voltage is applied to the common electrode. The common voltage may be applied to the shielding electrode SC. When the common voltage is applied to the shielding electrode SC, molecules of the liquid crystal disposed on the shielding electrode SC are aligned in a vertical direction. The vertically aligned liquid crystal layer does not alter an optical path of light pass through the liquid crystal layer so that a region on the shielding electrode SC may not transmit the light. Therefore, a light may be blocked without a black matrix.

The high-pixel electrode PE1 and the low-pixel electrode PE2 may be formed from the same layer as the shielding electrode SC. The high-pixel electrode PE1 and the low-pixel electrode PE2 may include a transparent conductive material, such as indium tin oxide (ITO) and indium zinc oxide (IZO). In addition, the high-pixel electrode PE1 and the low-pixel electrode PE2 may include titanium (Ti) and/or molybdenum titanium (MoTi).

The high-pixel electrode PE1 is disposed adjacent to the gate line GL in the second direction D2, and between the first data line DL1 and the second data line DL2. The high-pixel electrode PE1 is electrically connected to a first drain electrode DE1 of the first switching element SW1 through a first contact hole CNT1.

The low-pixel electrode PE2 is disposed opposite to the high-pixel electrode PE1 with reference to the gate line GL, and between the first data line DL1 and the second data line DL2. The low-pixel electrode PE2 is electrically connected to the second drain electrode DE2 of the second switching element SW2 and the third drain electrode DE3 of the third switching element SW3 through a second contact hole CNT2.

A first voltage may be applied to the high-pixel electrode PE1. A second voltage different from the first voltage may be applied to the low-pixel electrode PE2. For example, the first voltage may be higher than the second voltage, a portion of the pixel corresponding to the high-pixel electrode PE1 may be driven as a high pixel, and another portion of the pixel corresponding to the low-pixel electrode PE2 may be driven as a low pixel.

The second storage line Cst2 may be formed from the same layer as the data line DL. Thus, the second storage line Cst2 may be disposed on the same layer as the data line DL. The second storage line Cst2 may have a single layer structure including copper (Cu), silver (Ag), chrome (Cr), molybdenum (Mo), aluminum (Al), titanium (Ti), manganese (Mn) and a mixture thereof. In addition, the second storage line Cst2 may have a multi-layer structure having a plurality of layers including materials different from each other. For example, the second storage line Cst2 may include a copper layer and a titanium layer disposed on and/or under the copper layer. The second storage line Cst2 is electrically connected to a third source electrode SE3 of the third switching element SW3.

A light-blocking pattern SP is disposed on the shielding electrode SC. The light-blocking pattern SP may be disposed adjacent to corners of the high-pixel electrode PE1 and corners of the low-pixel electrode PE2. For example, the light-blocking pattern SP may be disposed on the shield electrode SC between adjacent pixel electrodes. As a result, the light-blocking pattern SP may be disposed at the four corners of the pixel electrode in a unit pixel. A unit pixel may have four light-blocking patterns SPs. The light-blocking pattern SP may include an opaque metal. The light-blocking pattern SP may have substantially the same width as the shielding electrode SC. The light-blocking pattern SP may have a smaller width than that of the shielding electrode SC. The light-blocking pattern SP may have a rectangular shape. The light-blocking pattern SP may decrease a light-leakage occurred between adjacent four pixel electrodes. The light-blocking pattern SP may be formed on the shield electrode SC in which adjacent four pixel electrodes adjoin. The four pixel electrodes may be a red pixel electrode, a green pixel electrode, a blue pixel electrode and a white pixel electrode.

The first switching element SW1 includes the first gate electrode GE1, the first source electrode SE1, the first drain electrode DE1 and a first channel portion CH1 electrically connecting the first source electrode SE1 to the first drain electrode DE1 when a turn-on voltage is applied to the first gate electrode GE1.

The first channel portion CH1 may include a semiconductor layer comprising amorphous silicon (a-Si:H) and an ohmic contact layer comprising n+ amorphous silicon (n+ a-Si:H). In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The second switching element SW2 includes the second gate electrode GE2, the second source electrode SE2, the second drain electrode DE2 and a second channel portion CH2 electrically connecting the second source electrode SE2 to the second drain electrode DE2 when a turn-on voltage is applied to the second gate electrode GE2.

The second channel portion CH2 may include a semiconductor layer comprising amorphous silicon (a-Si:H) and an ohmic contact layer comprising n+ amorphous silicon (n+ a-Si:H). In addition, the second channel portion CH2 may include an oxide semiconductor. The oxide semiconductor may include an amorphous oxide including at least one selected from the group consisting of indium (In), zinc (Zn), gallium (Ga), tin (Sn) and hafnium (Hf).

The third switching element SW3 includes the third gate electrode GE3, the third source electrode SE3, the third drain electrode DE3 and a third channel portion CH3 electrically connecting the third source electrode SE3 to the third drain electrode DE3 when a turn-on voltage is applied to the third gate electrode GE3.

The third channel portion CH3 may include a semiconductor layer comprising amorphous silicon (a-Si:H) and an ohmic contact layer comprising n+ amorphous silicon (n+ a-Si:H). In addition, the third channel portion CH3 may include an oxide semiconductor. The oxide semiconductor may include an amorphous oxide including at least one selected from the group consisting of indium (In), zinc (Zn), gallium (Ga), tin (Sn) and hafnium (Hf).

According to the present exemplary embodiment, the light-blocking pattern SP is disposed on the shielding electrode SC between adjacent pixel electrodes in which adjacent four pixel electrodes adjoin. The light-blocking pattern SP may be disposed adjacent to corners of the high-pixel electrode PE1 and corners of the low-pixel electrode PE2. For example, the light-blocking pattern SP may be disposed adjacent to four corners of the pixel electrode in a unit pixel. A unit pixel may have four light-blocking patterns SPs. The light-blocking pattern SP may include an opaque metal. The light-blocking pattern SP may have substantially the same width as the shielding electrode SC. The light-blocking pattern SP may have a smaller width than that of the shielding electrode SC. The light-blocking pattern SP may have a rectangular shape. The light-blocking pattern SP may decrease a light-leakage occurred between adjacent four pixel electrodes.

FIGS. 4 to 9 are cross-sectional views illustrating a method of manufacturing the display substrate of FIG. 3.

Figure 4:
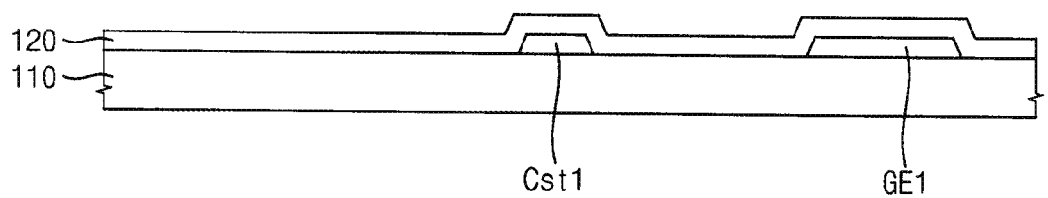
FIGS. 4 to 9 are cross-sectional views illustrating a method of manufacturing the display substrate of FIG. 3.

Referring to FIG. 4, a gate metal layer is formed on a base substrate 110, and then the gate metal layer may be patterned using a photolithography process to form the gate pattern. The gate pattern includes a first storage line Cst1, a gate line GL, a first gate electrode GE1, a second gate electrode GE2 and a third gate electrode GE3.

The base substrate 110 may include a material which has relatively high transmittance, thermal resistance, and chemical resistance. For example the base substrate 110 may include any one selected from the group consisting of glass, polyethylenenaphthalate, polyethylene terephthalate, polyacryl and a mixture thereof.

The gate pattern may include a metal, a metal alloy, a metal nitride, a conductive metal oxide, a transparent conductive material, and etc. For example, the gate pattern may include copper (Cu) which is opaque.

The first insulation layer 120 is disposed on the base substrate 110 on which the gate pattern is formed. The first insulation layer 120 may be a gate insulating layer. The first insulation layer 120 is disposed on the gate pattern. The first insulation layer 120 covers and insulates the first storage line Cst1, the gate line GL, the first gate electrode GE1, the second gate electrode GE2 and the third gate electrode GE3.

Figure 5:
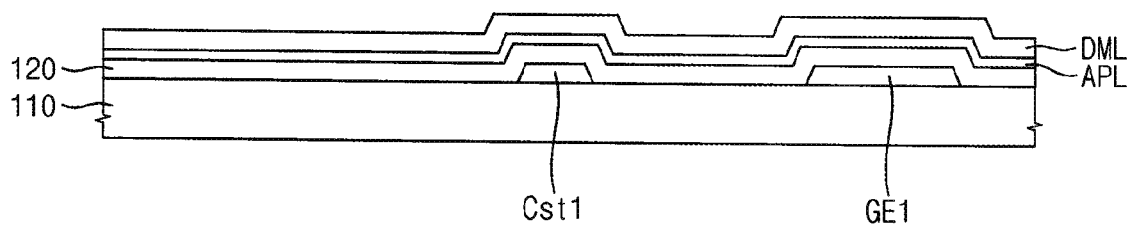

Referring to FIG. 5, a semiconductor layer APL and a data metal layer DML are formed on the base substrate 110 on which the first insulation layer 120 is formed.

The semiconductor layer APL may include a silicon semiconductor layer comprising amorphous silicon (a-Si:H) and an ohmic contact layer comprising n+ amorphous silicon (n+ a-Si:H). In addition, the semiconductor layer APL may include an oxide semiconductor. The oxide semiconductor may include an amorphous oxide including at least one selected from the group consisting of indium (In), zinc (Zn), gallium (Ga), tin (Sn) and hafnium (Hf).

The data metal layer DML may have a single layer structure including copper (Cu), silver (Ag), chrome (Cr), molybdenum (Mo), aluminum (Al), titanium (Ti), manganese (Mn) and a mixture thereof. In addition, the data metal layer DML may have a multi-layer structure having a plurality of layers including materials different from each other. For example, the data metal layer DML may include a copper layer and a titanium layer disposed on and/or under the copper layer.

Figure 6:
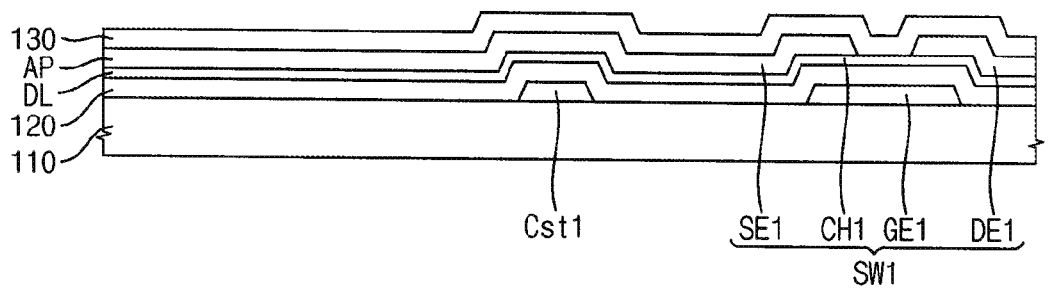

Referring to FIG. 6, the semiconductor layer APL and the data metal layer DML may be patterned using a photolithography process to form a channel layer AP including a first channel portion CH1, a second channel portion CH2 and a third channel portion CH3, and a data pattern. The channel layer AP may include a silicon semiconductor layer comprising amorphous silicon (a-Si:H) and an ohmic contact layer comprising n+ amorphous silicon (n+ a-Si:H). In addition, the channel layer AP may include an oxide semiconductor. The oxide semiconductor may include an amorphous oxide including at least one selected from the group consisting of indium (In), zinc (Zn), gallium (Ga), tin (Sn) and hafnium (Hf).

The data pattern includes a first drain electrode DE1, a first source electrode SE1, a second source electrode SE2, a second drain electrode DE2, a third source electrode SE3, a third drain electrode DE3, a first data line DL1 and a second data line DL2. For example, the semiconductor layer APL and the data metal layer DML are patterned at the same time by removing a portion of the metal layer which is not covered by a mask. Hence, the first source electrode SE1 and the first drain electrode DE1 spaced apart from the first source electrode SE1 may be formed. In addition, the second source electrode SE2 and the second drain electrode DE2 spaced apart from the second source electrode SE2 may be formed by removing a portion of the metal layer which is not covered by the mask. In addition, the third source electrode SE3 and the third drain electrode DE3 spaced apart from the third source electrode SE3 may be formed by removing a portion of the metal layer which is not covered by the mask.

A second insulation layer 130 is formed on the base substrate 110 on which the data pattern and the channel layer AP are formed.

The second insulation layer 130 may be formed by a spin coating process, a printing process, a sputtering process, a CVD process, an ALD process, a PECVD process, an HDP-CVD process or a vacuum evaporation process in accordance with ingredients included in the second insulation layer 130. The second insulation layer 130 is disposed on the data pattern. The second insulation layer 130 covers and insulates the first drain electrode DE1, the first source electrode SE1, the second source electrode SE2, the second drain electrode DE2, the third source electrode SE3, the third drain electrode DE3 and the data line DL.

Figure 7:
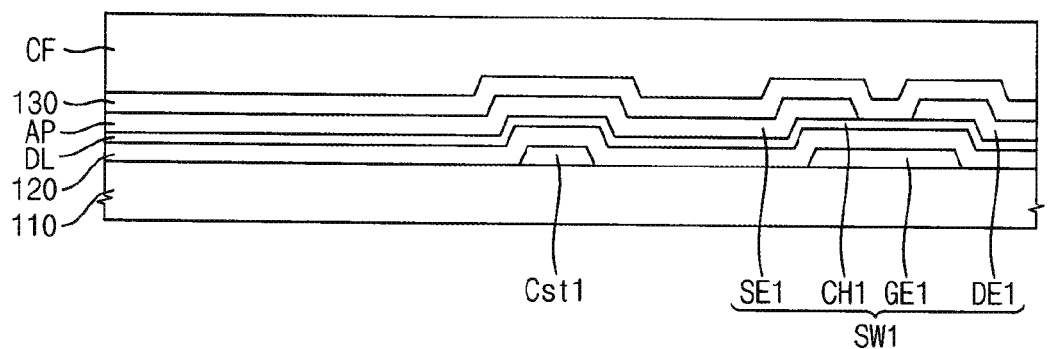

Referring to FIG. 7, an organic layer CF is formed on the base substrate 110 on which the second insulation layer 130 is formed. The organic layer CF may be a color filter layer. A photoresist including a color filter is formed on the second insulation layer 130, and then the photoresist is exposed using a mask, and then the photoresist is developed using a developing solution. Hence, the organic layer CF may be formed.

The organic layer CF is disposed on the second insulation layer 130. When the organic layer CF is a color filter layer, the color filter layer provides colors to the light passing through the liquid crystal layer. The color filter layer may include a red color filter layer, a green color filter layer or blue color filter layer. The color filter layer corresponds to a unit pixel. The color filter layers adjacent to each other may have different colors. The color filter layer may overlap an adjacent color filter layer in a boundary of adjacent unit pixels. In addition, the color filter layer may be spaced apart from the adjacent color filter layer in the boundary of the adjacent unit pixels. In addition, the color filter layer having a red color, the color filter layer having a green color, the color filter layer having a blue color and the color filter layer having a white color may be formed sequentially on a red pixel, a green pixel, a blue pixel and a white pixel, respectively.

Figure 8:
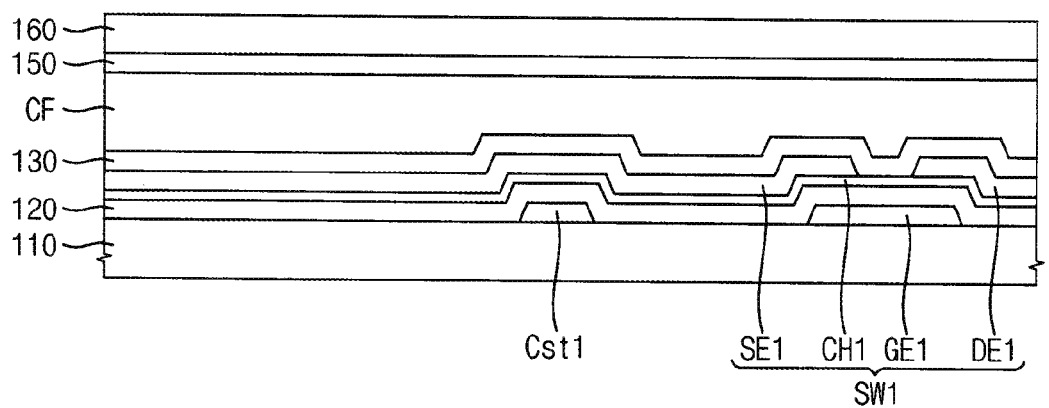

Referring to FIG. 8, a transparent conductive layer 150 and a light-blocking layer 160 are formed on the base substrate 110 on which the organic layer CF is formed.

The transparent conductive layer 150 may include a transparent conductive material, such as indium tin oxide (ITO) and indium zinc oxide (IZO). In addition, the transparent conductive layer 150 may include titanium (Ti) and/or molybdenum titanium (MoTi).

The light-blocking layer 160 may include an opaque metal, such as copper (Cu), silver (Ag), chrome (Cr), molybdenum (Mo), aluminum (Al), titanium (Ti), manganese (Mn) and a mixture thereof. In addition, the light-blocking layer 160 may include a multi-layer structure having a plurality of layers including materials different from each other. For example, the light-blocking layer 160 may include a copper layer and a titanium layer disposed on and/or under the copper layer. Thus, light is blocked by the light-blocking layer 160.

Figure 9:
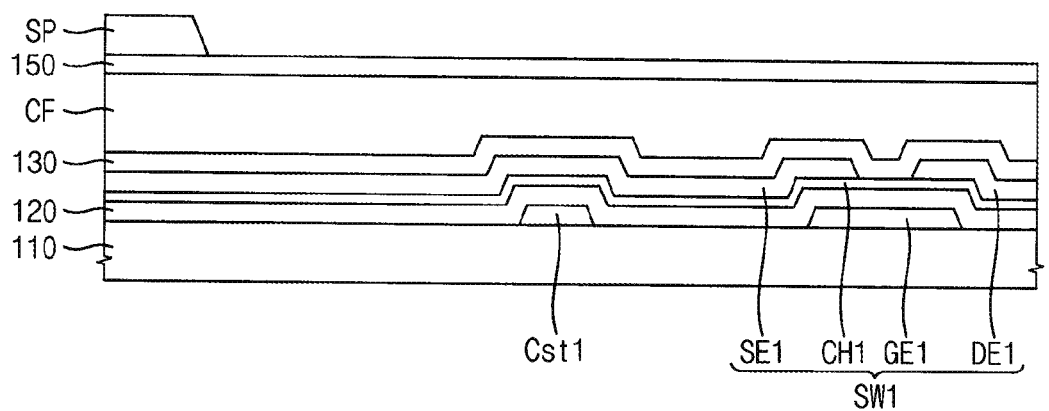

Referring to FIG. 9, the light-blocking layer 160 is patterned to be formed a light-blocking pattern SP.

After forming a photoresist layer (not shown) on the light-blocking layer 160, the photoresist layer may be exposed by using a half-tone mask. After the photoresist layer is exposed and developed, the light-blocking layer 160 is etched using the undeveloped photoresist layer as a mask. The light-blocking layer 160 is etched by using a wet etching process. After the light-blocking layer 160 is etched, an ashing process is performed, so that a light-blocking pattern SP is formed.

A light-blocking pattern SP is disposed on the shielding electrode SC. The light-blocking pattern SP may be disposed adjacent to corners of the high-pixel electrode PE1 and corners of the low-pixel electrode PE2. For example, the light-blocking pattern SP may be disposed adjacent to four corners of the pixel electrode in a unit pixel. A unit pixel may have four light-blocking patterns SPs. The light-blocking pattern SP may include an opaque metal. The light-blocking pattern SP may have substantially the same width as the shielding electrode SC. The light-blocking pattern SP may have a smaller width than that of the shielding electrode SC. The light-blocking pattern SP may have a rectangular shape. The light-blocking pattern SP may decrease a light-leakage occurred between four pixel electrodes.

Referring to FIG. 3, after the light-blocking pattern SP is formed, the transparent conductive layer 150 is patterned to form the shielding electrode SC and the pixel electrode. The pixel electrode may include the high-pixel electrode PE1 and the low-pixel electrode PE2.

The shielding electrode SC may include a transparent conductive material, such as indium tin oxide (ITO) and indium zinc oxide (IZO). In addition, the shielding electrode SC may include titanium (Ti) and/or molybdenum titanium (MoTi).

The high-pixel electrode PE1 and the low-pixel electrode PE2 may be formed from the same layer as the shielding electrode SC. The high-pixel electrode PE1 and the low-pixel electrode PE2 may include a transparent conductive material, such as indium tin oxide (ITO) and indium zinc oxide (IZO). In addition, the high-pixel electrode PE1 and the low-pixel electrode PE2 may include titanium (Ti) and/or molybdenum titanium (MoTi).

According to the present exemplary embodiment, the light-blocking pattern SP is disposed on the shielding electrode SC. The light-blocking pattern SP may be disposed adjacent to corners of the high-pixel electrode PE1 and corners of the low-pixel electrode PE2. For example, the light-blocking pattern SP may be disposed adjacent to four corners of the pixel electrode in a unit pixel. A unit pixel may have four light-blocking patterns SPs. The light-blocking pattern SP may include an opaque metal. The light-blocking pattern SP may have substantially the same width as the shielding electrode SC. The light-blocking pattern SP may have a smaller width than that of the shielding electrode SC. The light-blocking pattern SP may have a rectangular shape.

The light-blocking pattern SP may decrease a light-leakage occurred between four pixel electrodes.

Figure 10:
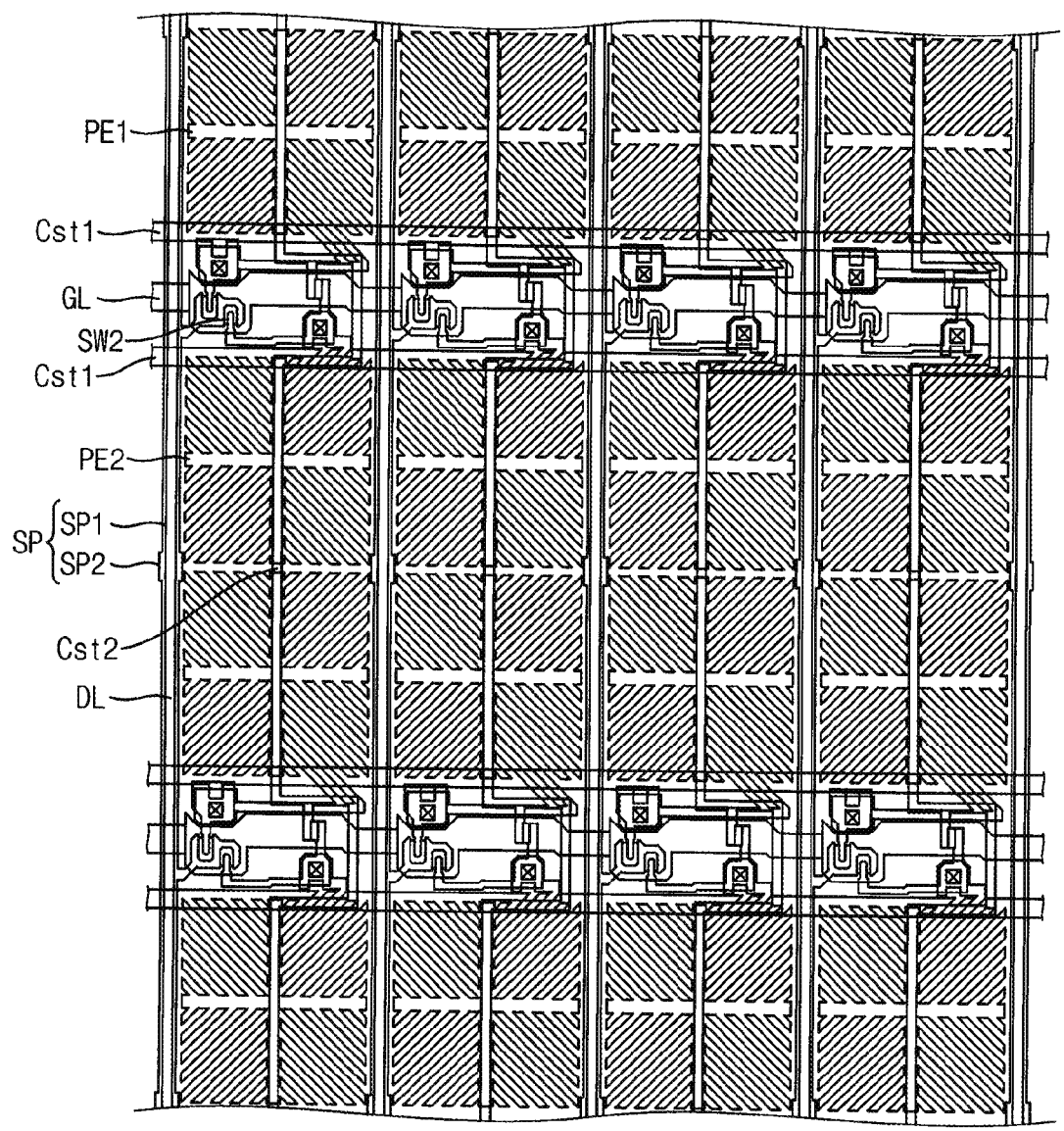
FIG. 10 is a plan view illustrating a display substrate according to an exemplary embodiment of the inventive concept.
Figure 11:
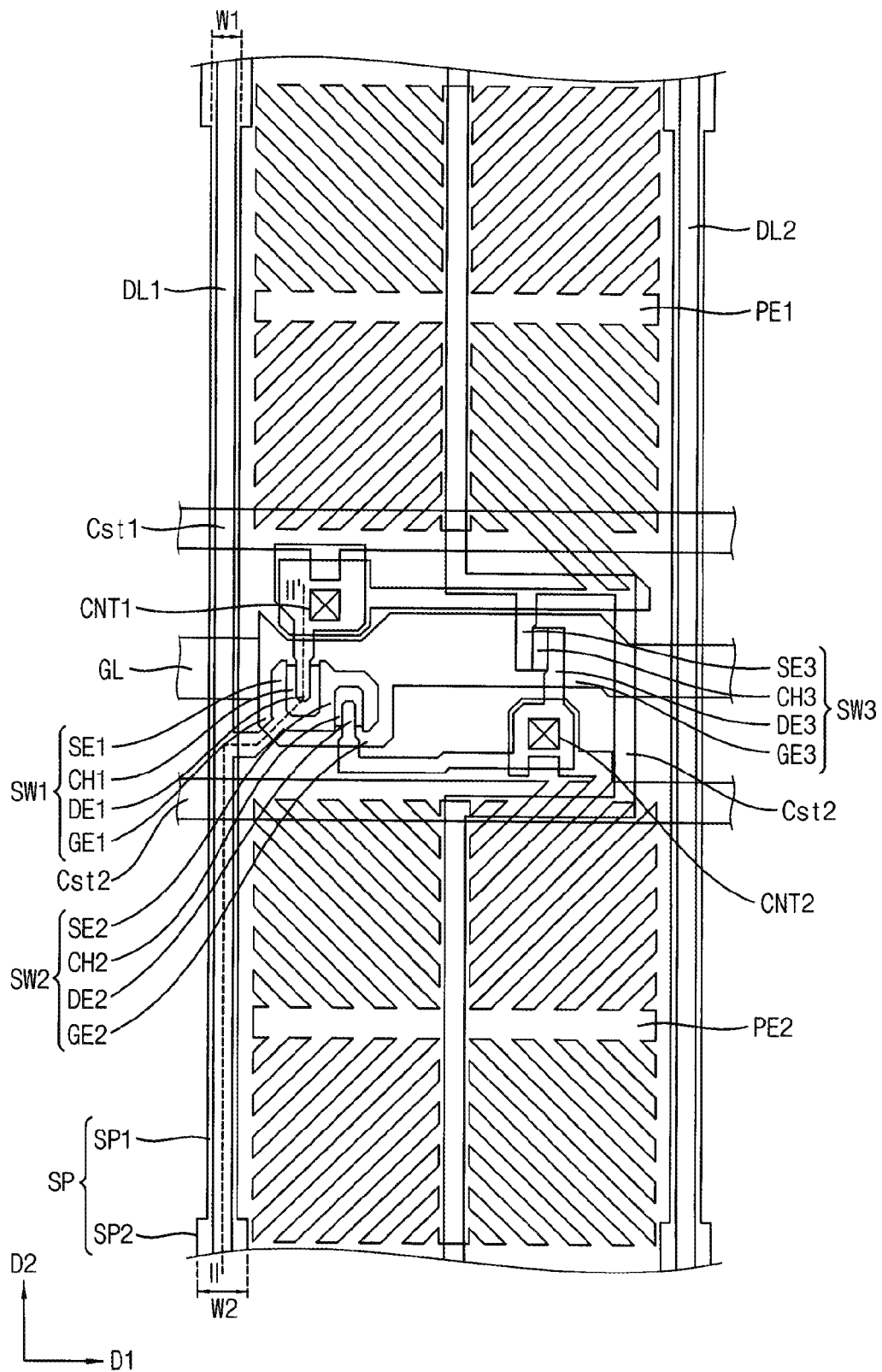
FIG. 11 is a plan view illustrating a unit pixel of the display substrate of FIG. 10.
Figure 12:
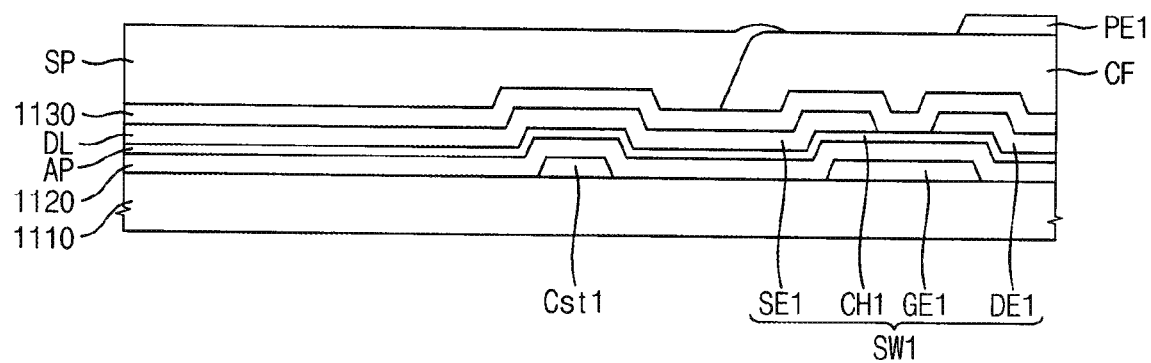
FIG. 12 is a cross-sectional view taken along a line II-II' of FIG. 11.

FIG. 10 is a plan view illustrating a display substrate according to an exemplary embodiment of the inventive concept. FIG. 11 is a plan view illustrating a unit pixel of the display substrate of FIG. 10. FIG. 12 is a cross-sectional view taken along a line II-II' of FIG. 11.

Referring to FIGS. 10 to 12, a display substrate includes a gate line GL, a data line DL, a first storage line Cst1, a second storage line Cst2, a first switching element SW1, a second switching element SW2, a third switching element SW3, a high-pixel electrode PE1 and a low-pixel electrode PE2.

The gate line GL extends in a first direction D1. The gate line GL may have a single layer structure including copper (Cu), silver (Ag), chrome (Cr), molybdenum (Mo), aluminum (Al), titanium (Ti), manganese (Mn) and a mixture thereof. In addition, the gate line GL may have a multi-layer structure having a plurality of layers including materials different from each other. For example, the gate line GL may include a copper layer and a titanium layer disposed on and/or under the copper layer. The gate line GL is electrically connected to a first gate electrode GE1 of the first switching element SW1, a second gate electrode GE2 of the second switching element SW2, and a third gate electrode GE3 of the third switching element SW3. In addition, portions of the gate line GL may form the first gate electrode GE1, the second gate electrode GE2, and the third gate electrode GE3.

The first storage line Cst1 extends in a first direction D1. The first storage line Cst1 overlaps the high-pixel electrode PE1. The first storage line Cst1 is formed of the same layer as the gate line GL. Thus, the first storage line Cst1 may be disposed on the same layer as the gate line GL. The first storage line Cst1 may have a single layer structure including copper (Cu), silver (Ag), chrome (Cr), molybdenum (Mo), aluminum (Al), titanium (Ti), manganese (Mn) and a mixture thereof. In addition, the first storage line Cst1 may have a multi-layer structure having a plurality of layers including materials different from each other. For example, the first storage line Cst1 may include a copper layer and a titanium layer disposed on and/or under the copper layer.

A first insulation layer 1120 is formed on the gate line GL and the first storage line Cst1. The first insulation layer 1120 may include an inorganic material such as silicon oxide (SiOx) and/or silicon nitride (SiNx). For example, the first insulation layer 1120 includes silicon oxide (SiOx), and may have a thickness of about 500 Å. In addition, the first insulation layer 1120 may include a plurality of layers including different materials from each other.

The data line DL is formed on first insulation layer 1120. The data line DL extends in a second direction D2 crossing the first direction D1. The data line DL crosses the gate line GL with an intervening the first insulation layer 120. The data line DL may have a single layer structure including copper (Cu), silver (Ag), chrome (Cr), molybdenum (Mo), aluminum (Al), titanium (Ti), manganese (Mn) and a mixture thereof. In addition, the data line DL may have a multi-layer structure having a plurality of layers including materials different from each other. For example, the data line DL may include a copper layer and a titanium layer disposed on and/or under the copper layer. The data line DL may be electrically connected to a first source electrode SE1 of the first switching element SW1, and a second source electrode SE2 of the second switching element SW2.

The second storage line Cst2 is formed from the same layer as the data line DL. Thus, the second storage line Cst2 may be disposed on the same layer as the data line DL. The second storage line Cst2 may have a single layer structure including copper (Cu), silver (Ag), chrome (Cr), molybdenum (Mo), aluminum (Al), titanium (Ti), manganese (Mn) and a mixture thereof. In addition, the second storage line Cst2 may have a multi-layer structure having a plurality of layers including materials different from each other. For example, the second storage line Cst2 may include a copper layer and a titanium layer disposed on and/or under the copper layer. The second storage line Cst2 may be electrically connected to a third source electrode SE3 of the third switching element SW3.

A second insulation layer 1130 is formed on the data line DL and the second storage line Cst2. The second insulation layer 1130 may include an inorganic material such as silicon oxide (SiOx) and/or silicon nitride (SiNx). For example, the second insulation layer 1130 includes silicon oxide (SiOx), and may have a thickness of about 500 Å. In addition, the second insulation layer 1130 may include a plurality of layers including different materials from each other.

An organic layer CF is disposed on the second insulation layer 1130. The organic layer CF planarizes an upper surface of the substrate so that problems due to the step such as disconnection of a signal line may be prevented. The organic layer CF may be an insulation layer including an organic material. For example, the organic layer CF may a color filter layer.

When the organic layer CF is a color filter layer, the color filter layer may be a color filter layer having a red color, a green color, a blue color or a white color. In addition, the color filter layer having a red color, the color filter layer having a green color, the color filter layer having a blue color and the color filter layer having a white color may be formed sequentially on a red pixel, a green pixel, a blue pixel and a white pixel, respectively.

A pixel electrode is formed on the organic layer CF. The pixel electrode may include a high-pixel electrode PE1 and a low-pixel electrode PE2. The high-pixel electrode PE1 and the low-pixel electrode PE2 may include a transparent conductive material, such as indium tin oxide (ITO) and indium zinc oxide (IZO). In addition, the high-pixel electrode PE1 and the low-pixel electrode PE2 may include titanium (Ti) and/or molybdenum titanium (MoTi).

A light-blocking pattern SP is disposed between the organic layers CF. The light-blocking pattern SP partially overlaps the organic layer CF. The light-blocking pattern SP extends in the second direction D2. The light-blocking pattern SP may include a first portion SP1 formed as a first width w1 and a second portion SP2 disposed at an end of the first portion SP1. The second portion SP2 is formed as a second width w2 wider than the first width w1. The second portion may be formed on the data line in which four pixel electrodes adjoin. The four pixel electrodes may be a red pixel electrode, a green pixel electrode, a blue pixel electrode and a white pixel electrode. The light-blocking pattern SP may include an opaque material.

The second portion SP2 may be disposed adjacent to corners of the high-pixel electrode PE1 and corners of the low-pixel electrode PE2. That is, the second portion SP2 may be disposed at an end of the first portion SP1. For example, the second portion SP2 may be disposed adjacent to four corners of the pixel electrode in a unit pixel. A unit pixel may have four second portions SP2. The second portion SP2 may have a wider width than a width of the first portion SP1. The second portion SP2 may have a rectangular shape. The second portion SP2 may decrease a light-leakage occurred between four pixel electrodes.

The high-pixel electrode PE1 is disposed adjacent to the gate line GL in the second direction D2, and between the first data line DL1 and the second data line DL2. The high-pixel electrode PE1 is electrically connected to a first drain electrode DE1 of the first switching element SW1 through a first contact hole CNT1.

The low-pixel electrode PE2 is disposed opposite to the high-pixel electrode PE1 with reference to the gate line GL, and between the first data line DL1 and the second data line DL2. The low-pixel electrode PE2 is electrically connected to the second drain electrode DE2 of the second switching element SW2 and the third drain electrode DE3 of the third switching element SW3 through a second contact hole CNT2.

A first voltage may be applied to the high-pixel electrode PE1. A second voltage different from the first voltage may be applied to the low-pixel electrode PE2. For example, the first voltage may be higher than the second voltage, a portion of the pixel corresponding to the high-pixel electrode PE1 may be driven as a high pixel, and another portion of the pixel corresponding to the low-pixel electrode PE2 may be driven as a low pixel.

The second storage line Cst2 may be formed from the same layer as the data line DL. Thus, the second storage line Cst2 may be disposed on the same layer as the data line DL. The second storage line Cst2 may have a single layer structure including copper (Cu), silver (Ag), chrome (Cr), molybdenum (Mo), aluminum (Al), titanium (Ti), manganese (Mn) and a mixture thereof. In addition, the second storage line Cst2 may have a multi-layer structure having a plurality of layers including materials different form each other. For example, the second storage line Cst2 may include a copper layer and a titanium layer disposed on and/or under the copper layer. The second storage line Cst2 is electrically connected to a third source electrode SE3 of the third switching element SW3.

The first switching element SW1 includes the first gate electrode GE1, the first source electrode SE1, the first drain electrode DE1 and a first channel portion CH1 electrically connecting the first source electrode SE1 to the first drain electrode DE1 when a turn-on voltage is applied to the first gate electrode GE1.

The first channel portion CH1 may include a semiconductor layer comprising amorphous silicon (a-Si:H) and an ohmic contact layer comprising n+ amorphous silicon (n+ a-Si:H). In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The second switching element SW2 includes the second gate electrode GE2, the second source electrode SE2, the second drain electrode DE2 and a second channel portion CH2 electrically connecting the second source electrode SE2 to the second drain electrode DE2 when a turn-on voltage is applied to the second gate electrode GE2.

The second channel portion CH2 may include a semiconductor layer comprising amorphous silicon (a-Si:H) and an ohmic contact layer comprising n+ amorphous silicon (n+ a-Si:H). In addition, the second channel portion CH2 may include an oxide semiconductor. The oxide semiconductor may include an amorphous oxide including at least one selected from the group consisting of indium (In), zinc (Zn), gallium (Ga), tin (Sn) and hafnium (Hf).

The third switching element SW3 includes the third gate electrode GE3, the third source electrode SE3, the third drain electrode DE3 and a third channel portion CH3 connecting the third source electrode SE3 to the third drain electrode DE3.

The third channel portion CH3 may include a semiconductor layer comprising amorphous silicon (a-Si:H) and an ohmic contact layer comprising n+ amorphous silicon (n+ a-Si:H). In addition, the third channel portion CH3 may include an oxide semiconductor. The oxide semiconductor may include an amorphous oxide including at least one selected from the group consisting of indium (In), zinc (Zn), gallium (Ga), tin (Sn) and hafnium (Hf).

According to the present exemplary embodiment, the light-blocking pattern SP may include a first portion SP1 formed as a first width w1 and a second portion SP2 disposed at an end of the first portion SP1. The second portion SP2 is formed as a second width w2 wider than the first width w1. The light-blocking pattern SP may include an opaque material. The second portion SP2 may be disposed adjacent to corners of the high-pixel electrode PE1 and corners of the low-pixel electrode PE2. That is, the second portion SP2 may be disposed at an end of the first portion SP1. For example, the second portion SP2 may be disposed adjacent to four corners of the pixel electrode in a unit pixel. A unit pixel may have four second portions SP2. The second portion may be formed on a data line in which four adjacent pixel electrodes adjoin. The second portion SP2 may have a wider width than a width of the first portion SP1. The second portion SP2 may have a rectangular shape. The second portion SP2 may decrease a light-leakage occurred between adjacent four pixel electrodes.

FIGS. 13 to 18 are cross-sectional views illustrating a method of manufacturing the display substrate of FIG. 12.

Figure 13:
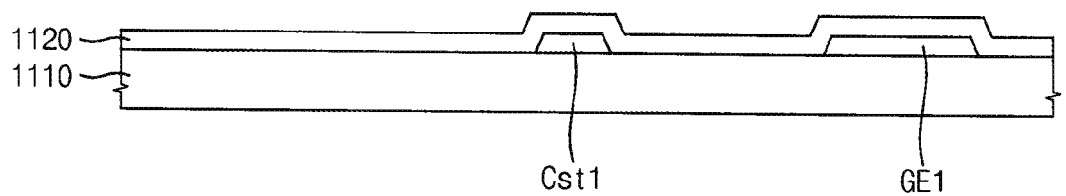
FIGS. 13 to 18 are cross-sectional views illustrating a method of manufacturing the display substrate of FIG. 12.

Referring to FIG. 13, a gate metal layer is formed on a base substrate 1110, and then the gate metal layer may be patterned using a photolithography process to form the gate pattern. The gate pattern includes a first storage line Cst1, a gate line GL, a first gate electrode GE1, a second gate electrode GE2 and a third gate electrode GE3.

The base substrate 1110 may include a material which has relatively high transmittance, thermal resistance, and chemical resistance. For example the base substrate 1110 may include any one selected from the group consisting of glass, polyethylenenaphthalate, polyethylene terephthalate, polyacryl and a mixture thereof.

The gate pattern may include a metal, a metal alloy, a metal nitride, a conductive metal oxide, a transparent conductive material, and etc. For example, the gate pattern may include copper (Cu) which is opaque.

The first insulation layer 1120 is disposed on the base substrate 1110 on which the gate pattern is formed. The first insulation layer 1120 may be a gate insulating layer. The first insulation layer 1120 is disposed on the gate pattern. The first insulation layer 1120 covers and insulates the first storage line Cst1, the gate line GL, the first gate electrode GE1, the second gate electrode GE2 and the third gate electrode GE3.

Figure 14:
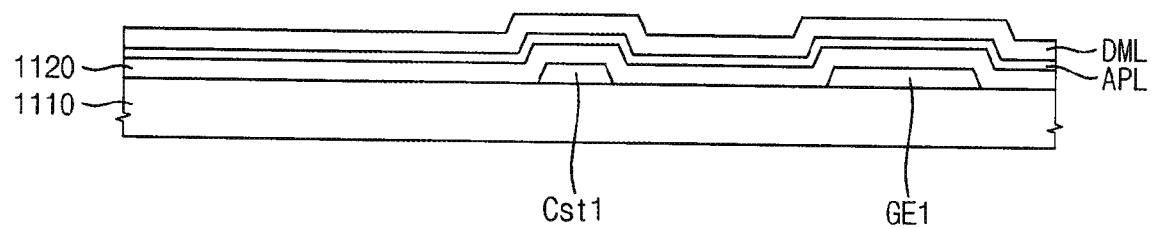

Referring to FIG. 14, a semiconductor layer APL and a data metal layer DML are formed on the base substrate 1110 on which the first insulation layer 1120 is formed.

The semiconductor layer APL may include a silicon semiconductor layer comprising amorphous silicon (a-Si:H) and an ohmic contact layer comprising n+ amorphous silicon (n+ a-Si:H). In addition, the semiconductor layer APL may include an oxide semiconductor. The oxide semiconductor may include an amorphous oxide including at least one selected from the group consisting of indium (In), zinc (Zn), gallium (Ga), tin (Sn) and hafnium (Hf).

The data metal layer DML may have a single layer structure including copper (Cu), silver (Ag), chrome (Cr), molybdenum (Mo), aluminum (Al), titanium (Ti), manganese (Mn) and a mixture thereof. In addition, the data metal layer DML may have a multi-layer structure having a plurality of layers including materials different from each other. For example, the data metal layer DML may include a copper layer and a titanium layer disposed on and/or under the copper layer.

Figure 15:
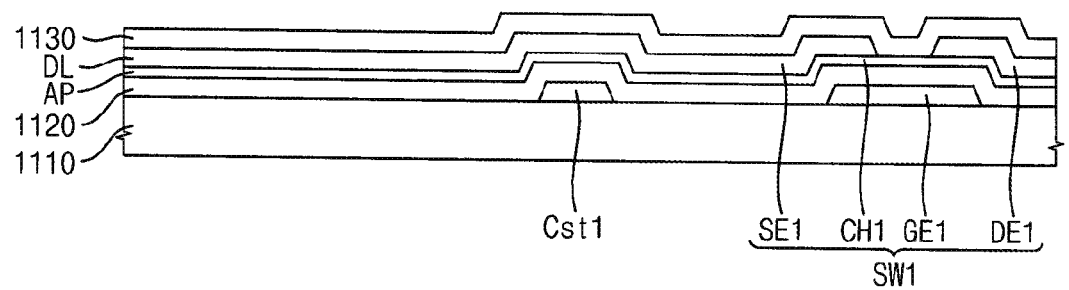

Referring to FIG. 15, the semiconductor layer APL and the data metal layer DML may be patterned using a photolithography process to form a channel layer AP including a first channel portion CH1, a second channel portion CH2 and a third channel portion CH3, and a data pattern. The channel layer AP may include a silicon semiconductor layer comprising amorphous silicon (a-Si:H) and an ohmic contact layer comprising n+ amorphous silicon (n+ a-Si:H). In addition, the channel layer AP may include an oxide semiconductor. The oxide semiconductor may include an amorphous oxide including at least one selected from the group consisting of indium (In), zinc (Zn), gallium (Ga), tin (Sn) and hafnium (Hf).

The data pattern includes a first drain electrode DE1, a first source electrode SE1, a second source electrode SE2, a second drain electrode DE2, a third source electrode SE3, a third drain electrode DE3, a first data line DL1 and a second data line DL2. For example, the semiconductor layer APL and the data metal layer DML are patterned at the same time by removing a portion of the metal layer which is not covered by a mask. Hence, the first source electrode SE1 and the first drain electrode DE1 spaced apart from the first source electrode SE1 may be formed. In addition, the second source electrode SE2 and the second drain electrode DE2 spaced apart from the second source electrode SE2 may be formed by removing a portion of the metal layer which is not covered by the mask. In addition, the third source electrode SE3 and the third drain electrode DE3 spaced apart from the third source electrode SE3 may be formed by removing a portion of the metal layer which is not covered by the mask.

A second insulation layer 130 is formed on the base substrate 110 on which the data pattern and the channel layer AP are formed.

The second insulation layer 1130 may be formed by a spin coating process, a printing process, a sputtering process, a CVD process, an ALD process, a PECVD process, an HDP-CVD process or a vacuum evaporation process in accordance with ingredients included in the second insulation layer 1130. The second insulation layer 1130 is disposed on the data pattern. The second insulation layer 1130 covers and insulates the first drain electrode DE1, the first source electrode SE1, the second source electrode SE2, the second drain electrode DE2, the third source electrode SE3, the third drain electrode DE3 and the data line DL.

Figure 16:
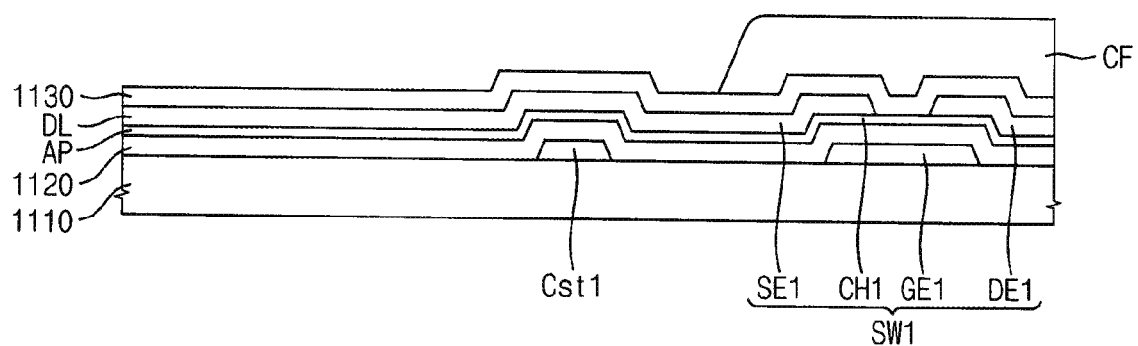

Referring to FIG. 16, an organic layer CF is formed on the base substrate 1110 on which the second insulation layer 1130 is formed. The organic layer CF may be a color filter layer. A photoresist including a color filter is formed on the second insulation layer 1130, and then the photoresist is exposed using a mask, and then the photoresist is developed using a developing solution. Hence, the organic layer CF may be formed.

The organic layer CF is disposed on the second insulation layer 1130. When the organic layer CF is a color filter layer, the color filter layer provides colors to the light passing through the liquid crystal layer. The color filter layer may include a red color filter layer, a green color filter layer or blue color filter layer. The color filter layer corresponds to a unit pixel. The color filter layers adjacent to each other may have different colors. The color filter layer may overlap an adjacent color filter layer in a boundary of adjacent unit pixels. In addition, the color filter layer may be spaced apart from adjacent color filter layer in the boundary of the adjacent unit pixels. In addition, the color filter layer having a red color, the color filter layer having a green color, the color filter layer having a blue color and the color filter layer having a white color may be formed sequentially on a red pixel, a green pixel, a blue pixel and a white pixel, respectively.

Figure 17:
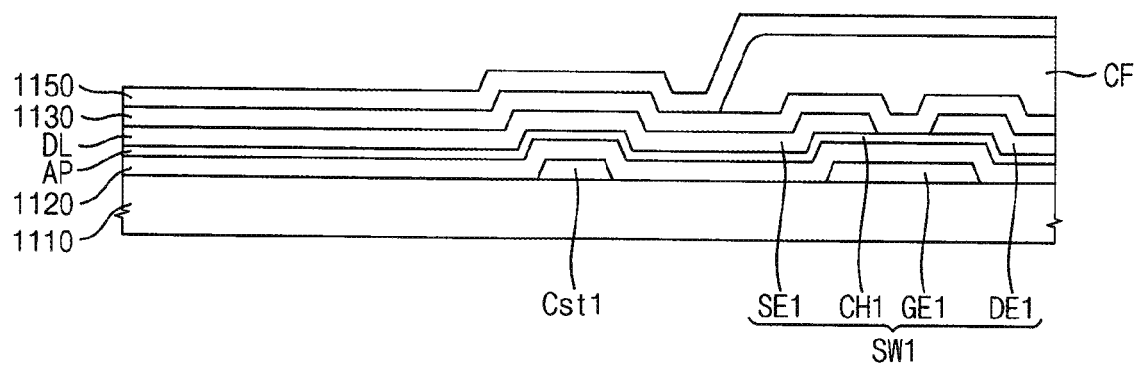

Referring to FIG. 17, a transparent conductive layer 1150 is formed on the base substrate 1110 on which the organic layer CF is formed.

The transparent conductive layer 1150 may include a transparent conductive material, such as indium tin oxide (ITO) and indium zinc oxide (IZO). In addition, the transparent conductive layer 1150 may include titanium (Ti) and/or molybdenum titanium (MoTi).

Figure 18:
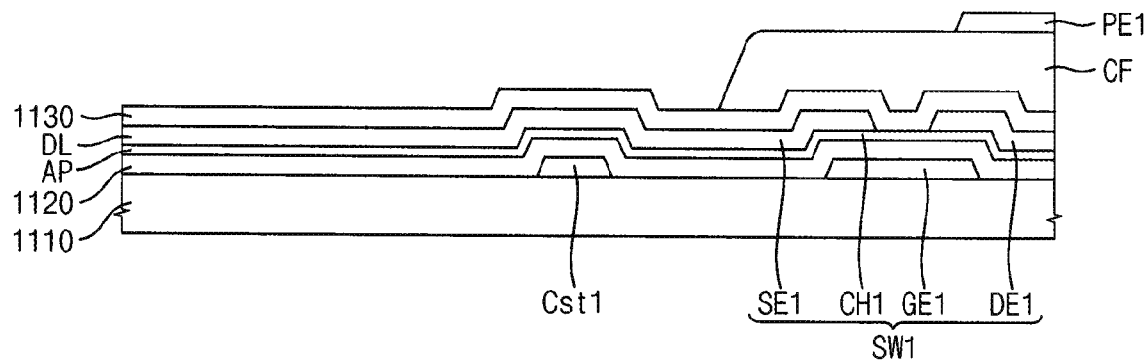

Referring to FIG. 18, the transparent conductive layer 1150 is patterned to form the pixel electrode. The pixel electrode may include the high-pixel electrode PE1 and the low-pixel electrode PE2.

The high-pixel electrode PE1 and the low-pixel electrode PE2 may include a transparent conductive material, such as indium tin oxide (ITO) and indium zinc oxide (IZO). In addition, the high-pixel electrode PE1 and the low-pixel electrode PE2 may include titanium (Ti) and/or molybdenum titanium (MoTi).

Referring to FIG. 12, a light-blocking pattern SP is formed on the base substrate 1110 on which the pixel electrode is formed.

The light-blocking pattern SP may partially overlap the organic layer CF. The light-blocking pattern SP extends in the second direction D2. The light-blocking pattern SP may include a first portion SP1 formed as a first width w1 and a second portion SP2 disposed at an end of the first portion SP1. The second portion SP2 is formed as a second width w2 wider than the first width w1. The light-blocking pattern SP may include an opaque material.

The second portion SP2 may be disposed adjacent to corners of the high-pixel electrode PE1 and corners of the low-pixel electrode PE2. That is, the second portion SP2 may be disposed at an end of the first portion SP1. For example, the second portion SP2 may be disposed adjacent to four corners of the pixel electrode in a unit pixel. A unit pixel may have four second portions SP2. The second portion SP2 may have a wider width than a width of the first portion SP1. The second portion SP2 may have a rectangular shape. The second portion SP2 may decrease a light-leakage occurred between four pixel electrodes.

According to the present exemplary embodiment, the light-blocking pattern SP may include a first portion SP1 formed as a first width w1 and a second portion SP2 disposed at an end of the first portion SP1. The second portion SP2 is formed as a second width w2 wider than the first width w1. The light-blocking pattern SP may include an opaque material. The second portion SP2 may be disposed adjacent to corners of the high-pixel electrode PE1 and corners of the low-pixel electrode PE2. That is, the second portion SP2 may be disposed at an end of the first portion SP1. For example, the second portion SP2 may be disposed adjacent to four corners of the pixel electrode in a unit pixel. A unit pixel may have four second portions SP2. The second portion SP2 may have a wider width than a width of the first portion SP1. The second portion SP2 may have a rectangular shape. The second portion SP2 may decrease a light-leakage occurred between four pixel electrodes.

According to the present inventive concept as explained above, a light-blocking pattern is disposed on the shielding electrode. The light-blocking pattern includes an opaque metal. The light-blocking pattern is disposed on an area in which four pixel electrodes adjoin, so that the light-blocking pattern may decrease a light-leakage occurred between four pixel electrodes.

In addition, a light-blocking pattern includes a second portion having wider width in a structure in which a shielding electrode is not formed. The second portion is disposed on an area in which four pixel electrodes adjoin, so that the light-blocking pattern may decrease a light-leakage occurred between four pixel electrodes.

The foregoing is illustrative of the present inventive concept and is not to be construed as limiting the scope of the present inventive concept. Although a few exemplary embodiments of the present inventive concept have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of the present inventive concept and is not to be construed as limited to the specific exemplary embodiments disclosed, and that modifications to the disclosed exemplary embodiments, as well as other exemplary embodiments, are intended to be included within the scope of the appended claims. The present inventive concept is defined by the following claims, with equivalents of the claims to be included therein.

What is claimed is:

1. A display substrate comprising:
   a first switching element electrically connected to a gate line extending in a first direction and a data line extending in a second direction crossing the first direction;
   an organic layer disposed on the first switching element;
   a shielding electrode disposed on the organic layer and overlapping the data line;
   a pixel electrode disposed on the same layer as the shielding electrode, each edges of the pixel electrode having a rectangular shape which includes four corner; and
   island shaped light-blocking patterns exclusively disposed on the shielding electrode adjacent to the four corner portions of the pixel electrode, the island shaped light-blocking patterns being not disposed on the shielding electrode disposed between two adjacent island shaped light-blocking patterns,
   wherein the light-blocking pattern extends along the second direction to overlap the data line and does not extend along the first direction to overlap the gate line.

2. The display substrate of claim 1, wherein the light-blocking pattern comprises an opaque metal.

3. The display substrate of claim 2, wherein the light-blocking pattern has substantially the same width as the shielding electrode.

4. The display substrate of claim 3, wherein the light-blocking pattern is formed on the shielding electrode in which four pixel electrodes adjoin.

5. The display substrate of claim 4, wherein the four pixel electrodes are a red pixel electrode, a green pixel electrode, a blue pixel electrode and a white pixel electrode.

6. The display substrate of claim 1, wherein the light-blocking pattern has a smaller width than that of the shielding electrode.

7. The display substrate of claim 6, wherein the light-blocking pattern is formed on the shielding electrode in which four pixel electrodes adjoin.

8. The display substrate of claim 7, wherein the four pixel electrodes are a red pixel electrode, a green pixel electrode, a blue pixel electrode and a white pixel electrode.

* * * * *